(12) United States Patent
Ko et al.

(10) Patent No.: US 10,256,852 B2
(45) Date of Patent: Apr. 9, 2019

(54) METHOD FOR PERFORMING COMMUNICATION AND ELECTRONIC DEVICE SUPPORTING SAME

(71) Applicant: Samsung Electronics Co., Ltd., Suwon-si, Gyeonggi-do (KR)

(72) Inventors: Sung-Hwan Ko, Seoul (KR); Man Seob Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/422,934

(22) Filed: Feb. 2, 2017

(65) Prior Publication Data
US 2017/0237448 A1    Aug. 17, 2017

(30) Foreign Application Priority Data

Feb. 17, 2016  (KR) .................. 10-2016-0018232

(51) Int. Cl.
| | |
|---|---|
| *H04B 1/04* | (2006.01) |
| *H04B 1/00* | (2006.01) |
| *H03H 7/38* | (2006.01) |
| *H01Q 1/50* | (2006.01) |
| *H03F 1/56* | (2006.01) |

(Continued)

(52) U.S. Cl.
CPC ............ *H04B 1/006* (2013.01); *H01Q 1/50* (2013.01); *H03F 1/565* (2013.01); *H03F 3/191* (2013.01); *H03F 3/24* (2013.01); *H03F 3/245* (2013.01); *H03H 7/38* (2013.01); *H03F 2200/111* (2013.01); *H03F 2200/321* (2013.01); *H03F 2200/378* (2013.01); *H03F 2200/387* (2013.01); *H03F 2200/451* (2013.01); *H04B 2001/0408* (2013.01)

(58) Field of Classification Search
CPC .......... H04B 1/02; H04B 1/04; H04B 1/0458
See application file for complete search history.

(56) References Cited

U.S. PATENT DOCUMENTS

| | | | | |
|---|---|---|---|---|
| 8,229,373 | B2* | 7/2012 | Tanoue | ............... H03F 1/0261 |
| | | | | 455/114.1 |
| 8,670,246 | B2* | 3/2014 | Ellis | .................. A43B 3/0005 |
| | | | | 257/316 |

(Continued)

*Primary Examiner* — Blane J Jackson
(74) *Attorney, Agent, or Firm* — Jefferson IP Law, LLP

(57) ABSTRACT

An electronic device is provided. The electronic device includes a communication module and a processor electrically connected to the communication module, wherein the communication module includes an antenna configured to transmit and receive a communication signal, a sensor configured to measure an impedance of the antenna, and a first matching circuit and a second matching circuit electrically connected to the antenna, and the processor is configured to receive information on the impedance of the antenna from the sensor, check control information on at least one of the first matching circuit and second matching circuit corresponding to the impedance of the antenna at least partially based on the received information on the impedance of the antenna, and transmit control information generated at least partially based on the checked control information to at least one of the first matching circuit and the second matching circuit corresponding to the control information.

18 Claims, 14 Drawing Sheets

(51) Int. Cl.
H03F 3/191 (2006.01)
H03F 3/24 (2006.01)

(56) References Cited

U.S. PATENT DOCUMENTS

| | | | | |
|---|---|---|---|---|
| 8,693,963 B2* | 4/2014 | du Toit | ................... | H01P 5/04 |
| | | | | 455/125 |
| 9,496,901 B2* | 11/2016 | Wehrmann | ........... | H04B 1/0458 |
| 2012/0319918 A1* | 12/2012 | Ramachandran | .... | H01Q 9/0442 |
| | | | | 343/852 |
| 2014/0024321 A1* | 1/2014 | Zhu | ..................... | H04B 1/0458 |
| | | | | 455/77 |
| 2015/0312058 A1* | 10/2015 | Black | ................. | H04L 25/0278 |
| | | | | 455/77 |
| 2015/0380812 A1 | 12/2015 | Black et al. | | |

* cited by examiner

METHOD FOR PERFORMING COMMUNICATION AND ELECTRONIC DEVICE SUPPORTING SAME

CROSS-REFERENCE TO RELATED APPLICATION(S)

This application claims the benefit under 35 U.S.C. § 119(a) of a Korean patent application filed on Feb. 17, 2016 in the Korean Intellectual Property Office and assigned Serial number 10-2016-0018232, the entire disclosure of which is hereby incorporated by reference.

TECHNICAL FIELD

The present disclosure relates to a method for performing communication and an electronic device supporting the same.

BACKGROUND

In order to perform ultrahigh-speed communication through various frequency bands, technologies related to an antenna of an electronic device have been developed. As a technology related to the antenna, there is an impedance matching technology that matches the impedance of the antenna of the electronic device to the impedance (or characteristic impedance) of a power amplifier of a transmitter that feeds the antenna.

The impedance matching technology is a technology for reducing the power consumed in transmitting a signal by minimizing the signal reflected to the power amplifier in response to the signal transmitted to the antenna. The electronic device includes an impedance matching circuit, and, for example, when the impedance of the antenna is changed due to the influence around the electronic device, the impedance matching circuit performs the impedance matching by controlling the impedance matching circuit.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method for performing communication, which controls a matching circuit in an adaptive manner according to the impedance of an antenna, and an electronic device supporting the same.

In accordance with an aspect of the present disclosure, an electronic device is provided. The electronic device includes a communication module and a processor electrically connected to the communication module. The communication module includes an antenna configured to transmit and receive a communication signal, a sensor configured to measure an impedance of the antenna, and a first matching circuit and a second matching circuit electrically connected to the antenna, and the processor is configured to receive information on the impedance of the antenna from the sensor, check control information for at least one of the first matching circuit and the second matching circuit corresponding to the impedance of the antenna at least partially based on the received information on the impedance of the antenna, and transmit control information generated at least partially based on the checked control information to at least one of the first matching circuit and second matching circuit corresponding to the control information.

In accordance with another aspect of the present disclosure, a method is provided. The method includes receiving information on an impedance of the antenna from a sensor, checking control information on at least one of a first matching circuit and a second matching circuit, which correspond to the impedance of the antenna and are electrically connected to the antenna at least partially based on the received information on the impedance of the antenna, and transmitting control information generated at least partially based on the checked control information to at least one of the first matching circuit and the second matching circuit corresponding to the control information.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
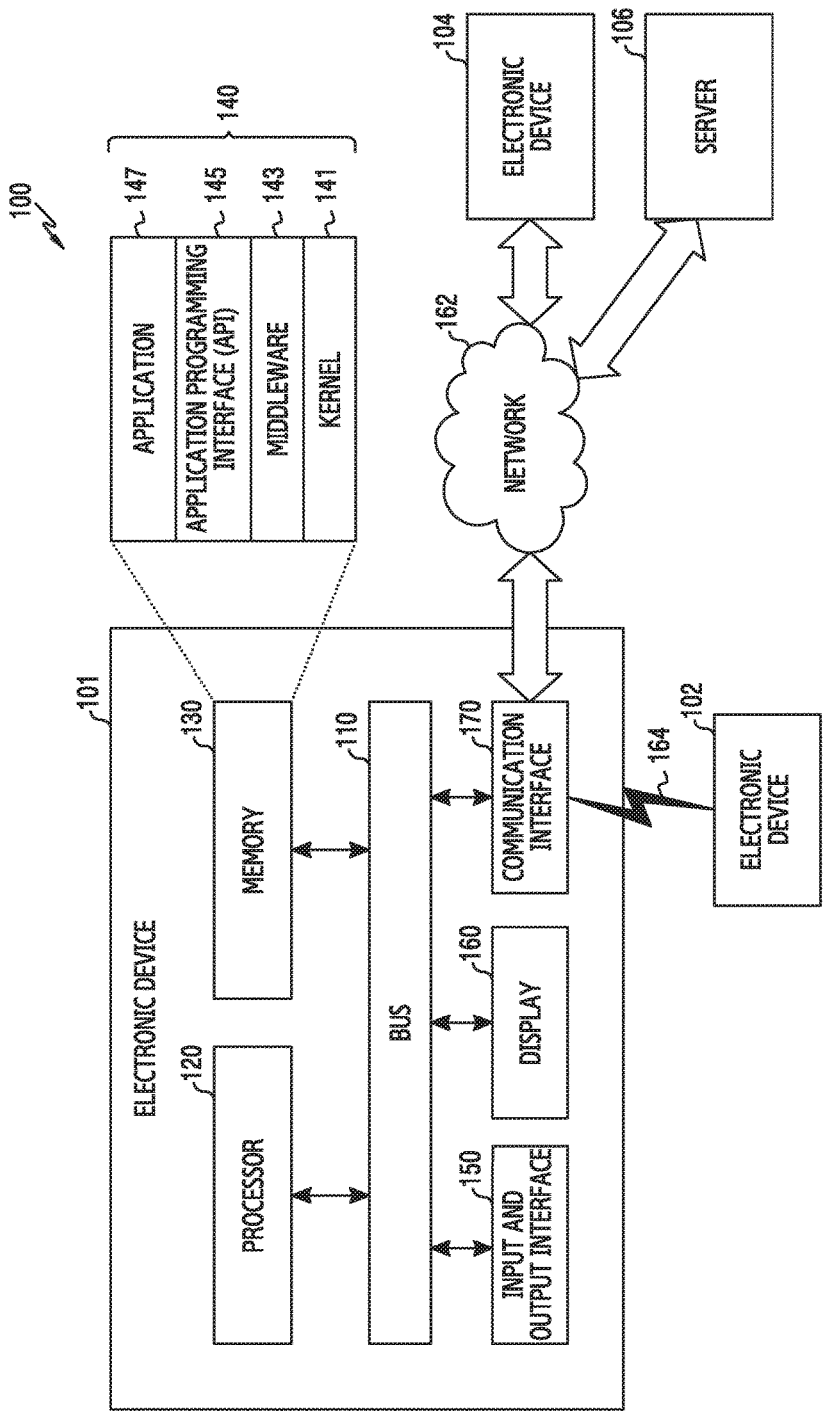
FIG. 1 illustrates a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television (TV), a digital versatile disc (DVD) player, an audio, a refrigerator, an air conditioner, a vacuum cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS)

receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

An electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device according to various embodiments of the present disclosure.

Referring to FIG. 1, an electronic device 101 within a network environment 100, according to various embodiments will be described. The electronic device 101 may include a bus 110, a processor 120, a memory 130, an input/output interface 150, a display 160, and a communication interface 170. In some embodiments, the electronic device 101 may omit at least one of the above elements or may further include other elements.

The bus 110 may include, for example, a circuit for connecting the elements 110-170 and transferring communication (e.g., control messages and/or data) between the elements.

The processor 120 may include one or more of a CPU, an AP, and a communication processor (CP). The processor 120, for example, may carry out operations or data processing relating to control and/or communication of at least one other element of the electronic device 101.

The memory 130 may include a volatile memory and/or a non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an application programming interface (API) 145, and/or application programs (or "applications") 147. At least some of the kernel 141, the middleware 143, and the API 145 may be referred to as an operating system (OS).

The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data.

In addition, the middleware 143 may process one or more operation requests received from the application program 147 according to priority. For example, the middleware 143 may give priority to use the system resources of the electronic device 101 (for example, the bus 110, the processor 120, the memory 130, and the like) to at least one of the application programs 147. For example, the middleware 143 may perform scheduling or load balancing with respect to the one or more operation requests by processing the one or more operation requests according to the priority given to the at least one application program.

The API 145 is an interface through which the applications 147 control functions provided from the kernel 141 or the middleware 143, and may include, for example, at least one interface or function (e.g., instruction) for file control, window control, image processing, or text control.

The input/output interface 150, for example, may function as an interface that may transfer instructions or data input from a user or another external device to the other element(s) of the electronic device 101. Furthermore, the input/output interface 150 may output the instructions or data received from the other element(s) of the electronic device 101 to the user or another external device.

The display 160 may include, for example, a liquid crystal display (LCD), a light emitting diode (LED) display, an organic LED (OLED) display, a micro electro mechanical system (MEMS) display, or an electronic paper display. The display 160, for example, may display various types of content (e.g., text, images, videos, icons, or symbols) for the user. The display 160 may include a touch screen and receive, for example, a touch, gesture, proximity, or hovering input using an electronic pen or the user's body part.

The communication interface 170, for example, may set communication between the electronic device 101 and an external device (e.g., a first external electronic device 102, a second external electronic device 104, or a server 106). For example, the communication interface 170 may be connected to a network 162 through wireless or wired communication to communicate with the external device (e.g., the second external electronic device 104 or the server 106).

The wireless communication may use at least one of, for example, long term evolution (LTE), LTE-advanced (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, short range communication 164. The short-range communication 164 may be performed by using at least one of, for example, Wi-Fi, Bluetooth (BT), Bluetooth low energy (BLE), near field communication (NFC), and global navigation satellite system (GNSS). The GNSS may include at least one of, for example, a GPS, a global navigation satellite system (Glonass), a Beidou navigation satellite system (referred to as "Beidou"), and a European global satellite-based navigation system (Galileo), according to a use area, a bandwidth, or the like. In the present disclosure, the "GPS" may be interchangeably used with the "GNSS". The wired communication may include at least one of, for example, a universal serial bus (USB), a high definition multimedia interface (HDMI), recommended standard 232 (RS-232), and a plain old telephone service (POTS). The network 162 may include at least one of a communication network such as a computer network (e.g., a local area network (LAN) or a wide area network (WAN)), the Internet, and a telephone network.

Each of the first and second external electronic apparatuses 102 and 104 may be of a type identical to or different from that of the electronic apparatus 101. According to an embodiment, the server 106 may include a group of one or more servers. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (e.g., the electronic device 102 or 104 or the server 106) instead of performing the functions or services by itself or in addition. Another electronic apparatus may execute the requested functions or the additional functions, and may deliver a result of the execution to the electronic apparatus 101. The electronic device 101 may process the received result as it is or additionally to provide the requested functions or services. To achieve this, for example, cloud computing, distributed computing, or client-server computing technology may be used.

Figure 2:
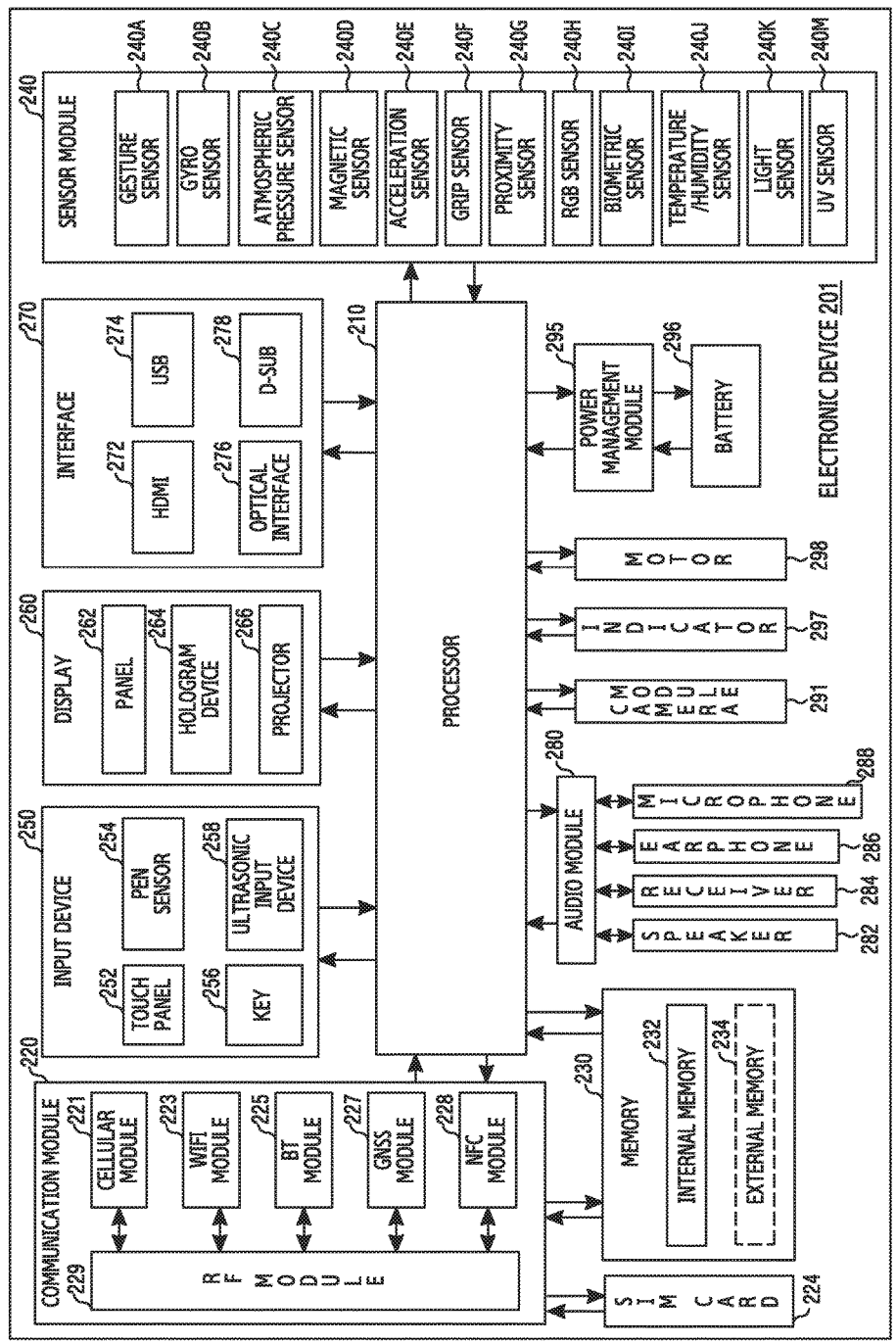
FIG. 2 is a block diagram of an electronic device according to various embodiments of the present disclosure.

FIG. 2 is a block diagram illustrating an electronic device according to various embodiments of the present disclosure.

Referring to FIG. 2, a block diagram of an electronic device 201 according to various embodiments is illustrated. For example, the electronic apparatus 201 may include the whole or part of the electronic apparatus 101 illustrated in FIG. 1. The electronic device 201 may include at least one processor (e.g., AP) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an OS or an application program and perform processing of various pieces of data and calculations. The processor 210 may be implemented by, for example, a system on chip (SoC). According to an embodiment, the processor 210 may further include a graphics processing unit (GPU) and/or an image signal processor (ISP). The processor 210 may include at least some (e.g., a cellular module 221) of the elements illustrated in FIG. 2. The processor 210 may load, into a volatile memory, instructions or data received from at least one (e.g., a non-volatile memory) of the other elements and may process the loaded instructions or data, and may store various data in a non-volatile memory.

In an embodiment, the processor 120 may include a processor to be described later in FIG. 4 (for example, a processor 460 of FIG. 4). For example, the processor 120 may receive information on the current impedance of the antenna, and perform an impedance matching operation at least partially based on the received information on the current impedance of the antenna The communication module 220 may have a configuration equal or similar to that of the communication interface 170 of FIG. 1. The communication module 220 may include, for example, the cellular module 221, a Wi-Fi module 223, a BT module 225, a GNSS module 227 (e.g., a GPS module, a Glonass module, a Beidou module, or a Galileo module), an NFC module 228, and a radio frequency (RF) module 229.

The cellular module 221 may provide a voice call, image call, a text message service, or an Internet service through, for example, a communication network. According to an embodiment, the cellular module 221 may distinguish between and authenticate electronic device 201 within a communication network using a SIM (for example, the SIM card 224). According to an embodiment of the present disclosure, the cellular module 221 may perform at least some of the functions that the processor 210 may provide. According to an embodiment, the cellular module 221 may include a CP.

Each of the Wi-Fi module 223, the BT module 225, the GNSS module 227, and the NFC module 228 may include, for example, a processor for processing data transmitted and received through the relevant module. According to some embodiments of the present disclosure, at least some (e.g., two or more) of the cellular module 221, the Wi-Fi module 223, the BT module 225, the GNSS module 227, and the NFC module 228 may be included in one integrated chip (IC) or IC package.

The RF module 229 may transmit/receive, for example, a communication signal (for example, an RF signal). The RF module 229 may include, for example, a transceiver, a power amplifier module (PAM), a frequency filter, a low noise amplifier (LNA), and an antenna.

In an embodiment, the RF module 229 may further include a plurality of matching circuits, sensors, and the like. For example, the plurality of matching circuits may include a first matching circuit 420 and a second matching circuit 430 of FIG. 4, which will be described later, as a configuration for matching the impedances of the antennas. For example, the sensor may sense a transmission signal transmitted from a PAM and a reflection signal transmitted by the antenna, and may transmit the sensed transmission signal and reflection signal to the processor (e.g., processor 120). In an embodiment, the sensor may include a coupler. However, the present disclosure is not limited thereto.

According to another embodiment of the present disclosure, at least one of the cellular module 221, the Wi-Fi module 223, the BT module 225, the GNSS module 227, and the NFC module 228 may transmit and receive RF signals through a separate RF module.

The SIM 224 may include, for example, a card including a subscriber identity module and/or an embedded SIM, and may contain unique identification information (e.g., an integrated circuit card identifier (ICCID)) or subscriber information (e.g., an international mobile subscriber identity (IMSI)).

The memory 230 (for example, the memory 130) may include, for example, an internal memory 232 or an external memory 234. The embedded memory 232 may include at least one of a volatile memory (for example, a dynamic random access memory (DRAM), a static RAM (SRAM), a synchronous dynamic RAM (SDRAM), and the like) and a non-volatile memory (for example, a one time programmable read only memory (OTPROM), a programmable ROM (PROM), an erasable and programmable ROM (EPROM), an electrically erasable and programmable ROM (EEPROM), a mask ROM, a flash ROM, a flash memory (for example, a NAND flash memory or a NOR flash memory), a hard disc drive, a solid state drive (SSD), and the like).

The external memory 234 may further include a flash drive, for example, a compact flash (CF), a secure digital (SD), a micro-SD, a mini-SD, an eXtreme digital (xD), a memory stick, or the like. The external memory 234 may be functionally and/or physically connected to the electronic apparatus 201 through various interfaces.

The sensor module 240 may measure a physical quantity or detect an operation state of the electronic device 201, and may convert the measured or detected information into an electrical signal. For example, the sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a red/green/blue (RGB) sensor), a bio-sensor 240I, a temperature/humidity sensor 240J, a light sensor 240K, and an ultra violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 240 may further include a control circuit for controlling one or more sensors included therein. In some embodiments of the present disclosure, the electronic apparatus 201 may further include a processor configured to control the sensor module 240 as a part of or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may use at least one of, for example, a capacitive type, a resistive type, an infrared type, and an ultrasonic type. Also, the touch panel 252 may further include a control circuit. The touch panel 252 may further include a tactile layer and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect ultrasonic wavers generated by an input tool through a microphone (for example, a microphone 288) and identify data corresponding to the detected ultrasonic waves.

The display 260 (for example, the display 160) may include a panel 262, a hologram device 264 or a projector 266. The panel 262 may include a configuration that is identical or similar to the display 160 illustrated in FIG. 1. The panel 262 may be implemented to be, for example, flexible, transparent, or wearable. The panel 262 and the touch panel 252 may be implemented as one module. The hologram 264 may show a three dimensional image in the air by using an interference of light. The projector 266 may display an image by projecting light onto a screen. The screen may be located, for example, inside or outside the electronic apparatus 201. According to an embodiment, the display 260 may further include a control circuit for controlling the panel 262, the hologram device 264, or the projector 266.

The interface 270 may include, for example, an HDMI 272, a USB 274, an optical interface 276, or a D-subminiature (D-sub) 278. The interface 270 may be included in, for example, the communication interface 170 illustrated in FIG. 1. Additionally or alternatively, the interface 270 may include, for example, a mobile high-definition link (MHL) interface, a SD card/multi-media card (MMC) interface, or an infrared data association (IrDA) standard interface.

The audio module 280 may bilaterally convert, for example, a sound and an electrical signal. At least some elements of the audio module 280 may be included in, for example, the input/output interface 150 illustrated in FIG. 1. The audio module 280 may process sound information which is input or output through, for example, a speaker 282, a receiver 284, earphones 286, the microphone 288 or the like.

The camera module 291 is a device which may photograph a still image and a dynamic image. According to an embodiment, the camera module 291 may include one or more image sensors (for example, a front sensor or a back sensor), a lens, an ISP or a flash (for example, LED or xenon lamp).

The power management module 295 may manage, for example, power of the electronic device 201. According to an embodiment, the power management module 295 may include a power management integrated circuit (PMIC), a charger IC, or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature during the charging. The battery 296 may include, for example, a rechargeable battery or a solar battery.

The indicator 297 may display a particular state (e.g., a booting state, a message state, a charging state, or the like) of the electronic apparatus 201 or a part (e.g., the processor 210). The motor 298 may convert an electrical signal into mechanical vibration, and may generate vibration, a haptic effect, or the like. Although not illustrated, the electronic apparatus 201 may include a processing unit (e.g., a GPU) for supporting a mobile TV. The processing unit for supporting mobile TV may, for example, process media data according to a certain standard such as digital multimedia broadcasting (DMB), digital video broadcasting (DVB), or mediaFLO™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
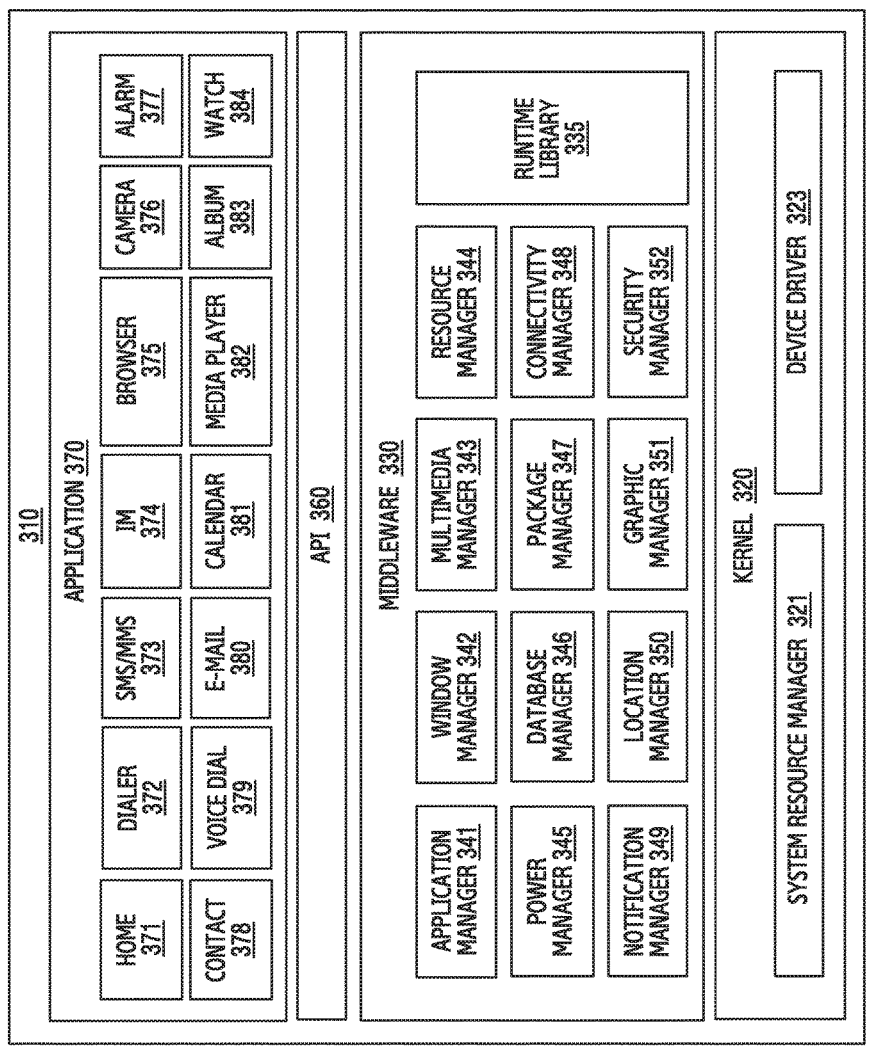
FIG. 3 is a block diagram of a program module according to various embodiments of the present disclosure.

FIG. 3 is a block diagram of a program module according to various embodiments of the present disclosure.

Referring to FIG. 3, the program module 310 (for example, the programs 140 shown in FIG. 1) may include an OS for controlling resources related to the electronic device (for example, the electronic device 101 shown in FIG. 1) and/or various applications (for example, the application programs 147 shown in FIG. 1) executed in the operating system. The operating system may be, for example, Android, iOS, Windows, Symbian, Tizen, Bada, or the like.

The programming module 310 may include a kernel 320, middleware 330, an API 360, and/or applications 370. At least some of the program module 310 may be preloaded in the electronic device or downloaded from the server.

The kernel 320 (for example, the kernel 141 shown in FIG. 1) may include, for example, a system resource manager 321 or a device driver 323. The system resource manager 321 may control, allocate, or collect the system resources. According to an embodiment, the system resource manager 321 may include a process management unit, a memory management unit, or a file system management unit. The device driver 323 may include, for example, a display driver, a camera driver, a BT driver, a shared-memory driver, a USB driver, a keypad driver, a WiFi driver, an audio driver, or an inter-process communication (IPC) driver.

The middleware 330 may provide a function required by the applications 370 in common or provide various functions to the applications 370 through the API 360 so that the applications 370 can efficiently use limited system resources within the electronic device. According to an embodiment, the middleware 330 (for example, the middleware 143 shown in FIG. 1) may include, for example, at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module that a compiler uses to add new functions through a programming language while the application 370 is executed. The runtime library 335 may perform input/output management, memory management, or a function for an arithmetic function.

The application manager 341 may manage, for example, a life cycle of at least one of the applications 370. The window manager 342 may manage graphical user interface (GUI) resources used by a screen. The multimedia manager 343 may grasp formats required for the reproduction of various media files, and may perform an encoding or decoding of the media file by using a codec suitable for the corresponding format. The resource manager 344 may manage resources such as a source code, a memory, and a storage space of at least one of the applications 370.

The power manager 345 may operate together with a basic input/output system (BIOS) to manage a battery or power and may provide power information required for the operation of the electronic device. The database manager 346 may generate, search for, or change a database to be used by at least one of the applications 370. The package manager 347 may manage the installation or the updating of applications distributed in the form of package file.

The connectivity manager 348 may manage wireless connection of, for example, Wi-Fi or BT. The notification manager 349 can display or notify of an event such as an arrival message, promise, proximity notification, and the like in such a way that does not disturb a user. The location manager 350 may manage location information of the electronic device. The graphic manager 351 may manage graphic effects to be provided to a user and user interfaces related to the graphic effects. The security manager 352 may provide all security functions required for system security or user authentication. According to an embodiment, when the electronic device (for example, electronic device 101 shown in FIG. 1) has a call function, the middleware 330 may further include a telephony manager for managing a voice call function or a video call function of the electronic device.

The middleware 330 may include a middleware module for forming a combination of various functions of the aforementioned components. The middleware 330 may provide modules specialized according to types of operating systems in order to provide differentiated functions. Further, the middleware 330 may dynamically remove some of the existing components or add new components.

The API 360 (for example, the API 145 shown in FIG. 1) is, for example, a set of API programming functions, and a different configuration thereof may be provided according to an operating system. For example, Android® or iOS® may provide one API set per platform, and Tizen® may provide two or more API sets per platform.

The applications 370 (for example, the application programs 147 shown in FIG. 1) may include, for example, one or more applications which can provide functions such as home 371, dialer 372, short message service (SMS)/multimedia message service (MMS) 373, instant message (IM) 374, browser 375, camera 376, alarm 377, contacts 378, voice dialer 379, email 380, calendar 381, media player 382, album 383, clock or watch 384, health care (for example, measure exercise quantity or blood sugar), or environment information (for example, atmospheric pressure, humidity, or temperature information).

According to an embodiment, the applications 370 may include an application (hereinafter, referred to as an "information exchange application" for convenience of the description) supporting information exchange between the electronic device (for example, the electronic device 101 shown in FIG. 1) and an external electronic device. The information exchange application may include, for example, a notification relay application for transferring predetermined information to an external electronic device or a device management application for managing an external electronic device.

For example, the notification relay application may include a function of transferring, to the external electronic device, notification information generated from other applications of the electronic device, 101 shown in FIG. 1, (for example, an SMS/MMS application, an e-mail application, a health management application, or an environmental information application). Further, the notification relay application may receive notification information from, for example, a control device and provide the received notification information to the user. The device management application may manage (for example, install, delete, or update), for example, a function for at least a part of the external electronic device communicating with the electronic device (for example, turning on/off the external electronic device itself (or some elements thereof) or adjusting brightness (or resolution) of a display), applications executed in the external electronic device, or services provided from the external electronic device (for example, a telephone call service or a message service).

According to an embodiment, the applications 370 may include an application (for example, health management application) designated according to attributes of the external electronic device (for example, attributes of the electronic device such as the type of electronic device which corresponds to a mobile medical device). According to an embodiment, the applications 370 may include an application received from the external electronic devices (for example, the server or the electronic device). According to an embodiment, the applications 370 may include a preloaded application or a third party application which can be downloaded from the server. The names of the components of the program module 310 according to the embodiment illustrated in FIG. 3 may vary according to the type of operating system.

According to various embodiments, at least some of the programming module 310 may be implemented by software, firmware, hardware, or a combination of two or more thereof. At least some of the programming module 310 may be implemented (for example, executed) by, for example, the processor (for example, the application program). At least some of the programming module 310 may include, for example, a module, program, routine, sets of instructions, or process for performing one or more functions.

Figure 4:
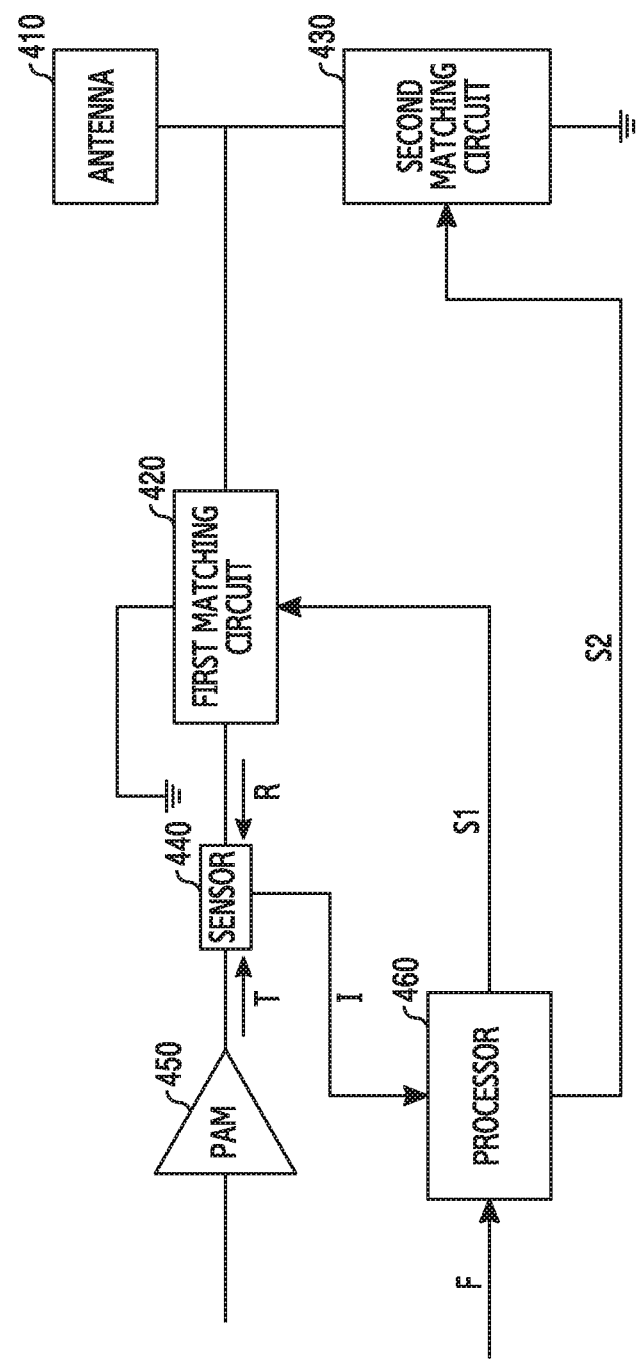
FIG. 4 is a block diagram illustrating a configuration of an electronic device for performing impedance matching according to an embodiment of the present disclosure.

FIG. 4 is a block diagram illustrating the configuration of an electronic device for performing impedance matching according to an embodiment of the present disclosure.

Referring to FIG. 4, the electronic device 101 may include an antenna 410, a first matching circuit 420, a second matching circuit 430, a sensor 440, a PAM 450, a processor 460, and the like. In an embodiment, the antenna 410, the first matching circuit 420, the second matching circuit 430, the sensor 440, and the PAM 450 may be included in the communication module 220 or an RF module 229 in FIG. 2. In an embodiment, the processor 460 may be included in the processor 120 of FIG. 1. However, the present disclosure is not limited thereto.

In an embodiment, the antenna 410 may radiate the radio signal to the outside or receive the radio signal from the outside. In an embodiment, the antenna 410 may support wireless communication using various frequency bands. In an embodiment, the antenna 410 may be implemented in various shapes. In an embodiment, the antenna 410 may include one or more antennas 410. However, the present disclosure is not limited thereto.

In an embodiment, the first matching circuit 420 may be electrically connected to the antenna 410 and the processor 460. In another embodiment, the first matching circuit 420 may be electrically connected to the antenna 410, the processor 460, and the sensor 440. In another embodiment, the first matching circuit 420 may be electrically connected to the antenna 410, the processor 460, the sensor 440, and the ground.

In an embodiment, the first matching circuit 420 may perform a matching operation of an impedance of the antenna 410 and an impedance of the PAM 450 (or the impedance of the transmitting end or the characteristic impedance). For example, the first matching circuit 420 may perform an operation of minimizing a reflection signal R received by the antenna 410 and maximizing a transmission signal T (or an operation of minimizing the reflection coefficient) at least partially based on a control signal S1 received from the processor 460. In an embodiment, the first matching circuit 420 may be a configuration of matching the impedance of the antenna 410 when the impedance of the antenna 410 is changed due to a user's grip of the electronic device 101, an access by an external object, or the attachment (or mounting) of accessories, and the like. However, the present disclosure is not limited thereto.

In an embodiment, the first matching circuit 420 may include at least one switching element, a capacitive element (for example, a capacitor, etc.), and an inductive element (for example, an inductor, etc.), or a combination thereof. The configuration of the first matching circuit 420 will be described later in detail with reference to FIGS. 5A and 5B.

In an embodiment, the second matching circuit 430 may be electrically connected to the antenna 410 and the processor 460. In another embodiment, the second matching circuit 430 may be electrically connected to the antenna 410, the processor 460, and the ground.

In an embodiment, the second matching circuit 430 may operate at least partially based on a control signal S2 received from the processor 460. For example, the second matching circuit 430 may operate, when it becomes the specified state, at least partially based on the control signal S2 received from the processor 460.

In an embodiment, the state specified to use the second matching circuit 430 may include a state where there is a change in the impedance in which the impedance matching cannot be performed using only the first matching circuit 420. For example, the specified state may include the occurrence of impedance change in which the impedance matching cannot be performed using only the first matching circuit 420, such as when a USB connector or an ear jack is connected to the electronic device 101. In another embodiment, the specified state may include a state where there is a change in the frequency band in which radio signals are transmitted and received. For example, the specified state may include a case where the frequency band used for transmitting the radio signal is changed from a first frequency band to a second frequency band. However, the specified state is not limited to the above-described example. For example, the specified state may include a case where the impedance of the antenna 410 changes to a specified range (or a specified impedance range). In another example, the specified state may include a state where the processor 460 receives the specified event. However, the present disclosure is not limited thereto.

In an embodiment, the sensor 440 may be electrically connected to the first matching circuit 420, the PAM 450, the processor 460, and the like. In an embodiment, the sensor 440 may sense (or detect) the current impedance of the antenna 410. For example, the sensor 440 may detect a transmission signal T transmitted from the PAM 450 to the antenna 410 and a reflection signal R received by the antenna 410. In an embodiment, the sensor 440 may transmit, to the processor 460, the detected transmission signal T and reflection signal R, for example, information I on the current impedance of the antenna 410. In an embodiment, the sensor 440 may include a coupler. However, the present disclosure is not limited thereto.

In an embodiment, the PAM 450 may be electrically connected to the sensor 440. In an embodiment, the PAM 450 may amplify the magnitude (or intensity) of the incoming transmission signal, and output the amplified transmission signal T. Although not shown in FIG. 4, the PAM 450 may receive an input of a transmission signal, which is generated and modulated from a modem or various communication modules. However, the present disclosure is not limited thereto.

In an embodiment, the processor 460 may be electrically connected to the first matching circuit 420, the second matching circuit 430, and the sensor 440. In an embodiment, the processor 460 may generate a control signal for the impedance matching at least partially based on the signal F for the frequency band used for the current communication and the information I on the current impedance of the antenna 410.

In an embodiment, the processor 460 may receive information on the current impedance of the antenna 410 from the sensor 440, and may receive, from at least one other processor 460 (e.g., AP 460), a signal for the frequency band currently being used.

In an embodiment, the processor 460 may generate the control signal S1 for controlling the first matching circuit 420 to perform the impedance matching at least partially based on the signal F for the frequency band and the information I on the current impedance of the antenna 410. For example, the processor 460 may search for (or check) a table in which the frequency band is currently being used and the current impedance of the antenna 410 are mapped to control information corresponding to the frequency band and the current impedance of the antenna 410, so as to generate the control signal S1. In an embodiment, when the first matching circuit 420 includes a switching element, the table may include control information on the on/off configuration for the switching element. In another embodiment, when a switching element included in the first matching circuit 420 is switched by a capacitive element, an inductive element, or a combination thereof, the table may include control information and the like for establishing a connection with the capacitive element, the inductive element, or a combination thereof. In an embodiment, the table may be stored in a memory or the processor 460. However, the present disclosure is not limited thereto.

In another embodiment, the processor 460 may generate the control signal S2 for controlling the second matching circuit 430 and the control signal S1 for selectively controlling the first matching circuit 420 to perform the impedance matching at least partially based on the signal F for the frequency band and the information I on the current impedance. For example, the processor 460 may search for (or check) a table in which the frequency band currently being used and the current impedance of the antenna 410 are mapped to control information that is configured to correspond to the frequency band and current impedance of the antenna 410, so as to generate the control signal S2 and selectively generate the control signal S1. For example, the processor 460 may search for the table, and generate the control signal S2 at least partially based on the control information specified to correspond to the frequency band and the current impedance. For another example, the processor 460 may search for the table, and generate the control signal S2 and control signal S1 at least partially based on the control information specified to correspond to the frequency band and the current impedance. For another example, when it is determined that the impedance of the antenna 410 corresponds to the specified state while performing the matching operation using the first matching circuit 420, the processor 460 may generate the control signal S2 for controlling the second matching circuit 430. When the processor 460 transmits the generated control signal S2 to the second matching circuit 430, the processor 460 may generate the control signal S1 at least partially based on the current impedance information of the antenna 410, received from the sensor 440, and transmit the generated control signal S1 to the first matching circuit 420.

In an embodiment, the processor 460 may periodically generate control signals S1 and S2 at least partially based on information on the current impedance of the antenna 410, received from the sensor 440. For example, the processor 460 may periodically generate the control signals S1 and S2 at least partially based on a count operation of a timer. However, the present disclosure is not limited thereto.

In an embodiment, the processor 460 may include a CP 460, a modem processor (MP), or a baseband processor (BP). However, the present disclosure is not limited thereto.

In various embodiments of the present disclosure, although not shown in FIG. 4, the electronic device 101 may further include at least one of a duplexer, a tuner, and a configuration for signal modulation/demodulation, and the like. However, the present disclosure is not limited thereto.

Figure 5B:
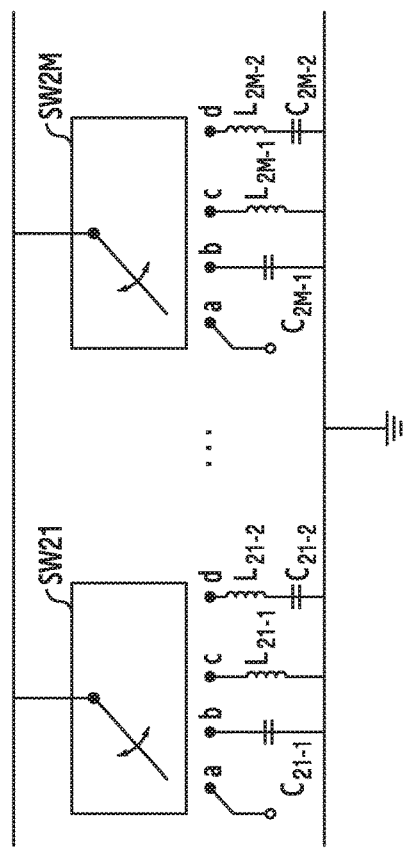
FIGS. 5A and 5B are block diagrams illustrating a first matching circuit according to an embodiment of the present disclosure.
Figure 5A:
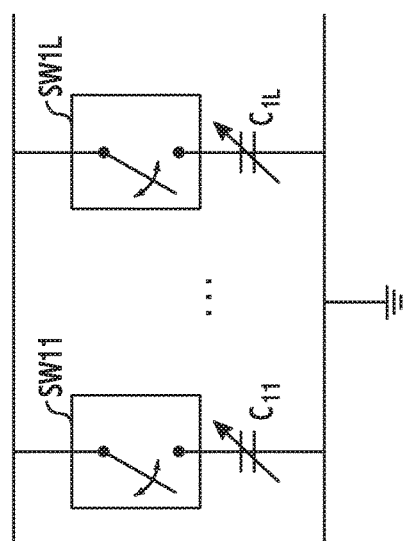

FIGS. 5A and 5B are block diagrams illustrating a first matching circuit according to an embodiment of the present disclosure.

Referring to FIG. 5A, the first matching circuit 420 including a plurality of switching elements SW11 to SW1L, and variable capacitors $C_{11}$ to $C_{1L}$ capable of being connected to the plurality of switching elements SW11 to SW1L are illustrated, respectively.

In an embodiment, each of the plurality of switching elements SW11 to SW1L may be connected to the variable capacitors $C_{11}$ to $C_{1L}$ according to the control signal S1. In another embodiment, the capacitance of the variable capacitor may vary according to the control signal S1. In another embodiment, the switching operation of each of the plurality of switching elements SW11 to SW1L and the capacitances of the variable capacitors $C_{11}$ to $C_{1L}$ may vary according to the control signal S1. FIG. 5A illustrates the variable capacitors $C_{11}$ to $C_{1L}$, but is not limited thereto. For example, the variable inductors may be used instead of the variable capacitors $C_{11}$ to $CH_{1L}$. However, the present disclosure is not limited thereto.

Referring to FIG. 5B, the first matching circuit 420 including a plurality of switching elements SW21 to SW2M and elements capable of being connected to the plurality of switching elements SW21 to SW2M are illustrated, respectively.

In an embodiment, each of the plurality of switching elements SW21 to SW2M may be connected to a node a of an open circuit, a node b connected to the capacitors $C_{21-1}$ to $C_{2M-1}$, a node c connected to the inductors $L_{21-1}$ to $L_{2M-1}$, and a node d connected to the capacitors $C_{21-2}$ to $C_{2M-2}$ and inductors $L_{21-2}$ to $L_{2M-2}$ according to the control signal S1.

In an embodiment, the first matching circuit 420 of FIGS. 5A and 5B are illustrated as an example, and the technical idea of the present disclosure is not limited thereto.

Figure 6:
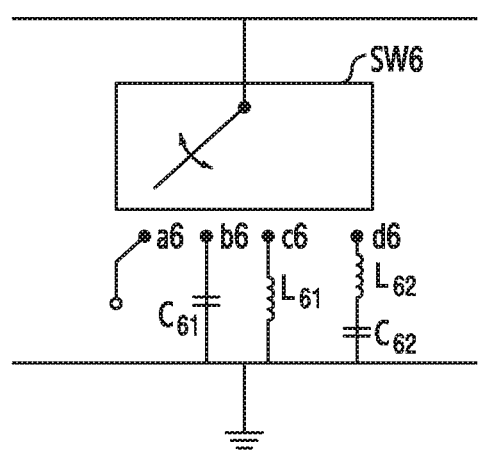
FIG. 6 is a block diagram illustrating a second matching circuit according to an embodiment of the present disclosure.

FIG. 6 is a block diagram illustrating a second matching circuit according to an embodiment of the present disclosure.

Referring to FIG. 6, in an embodiment, the second matching circuit may include a switching element SW6, and an element capable of being connected to the switching element SW6.

In an embodiment, a switching element SW6 may be connected to a node a6 of an open circuit, a node b6 connected to a capacitors $C_{61}$, a node c6 connected to an inductor $L_{61}$, and a node d6 connected to the capacitors $C_{62}$ and inductors $L_{62}$ according to the control signal S2.

In an embodiment, the second matching circuit of FIG. 6 is illustrated as an example, and the technical idea of the present disclosure is not limited thereto.

Figure 7:
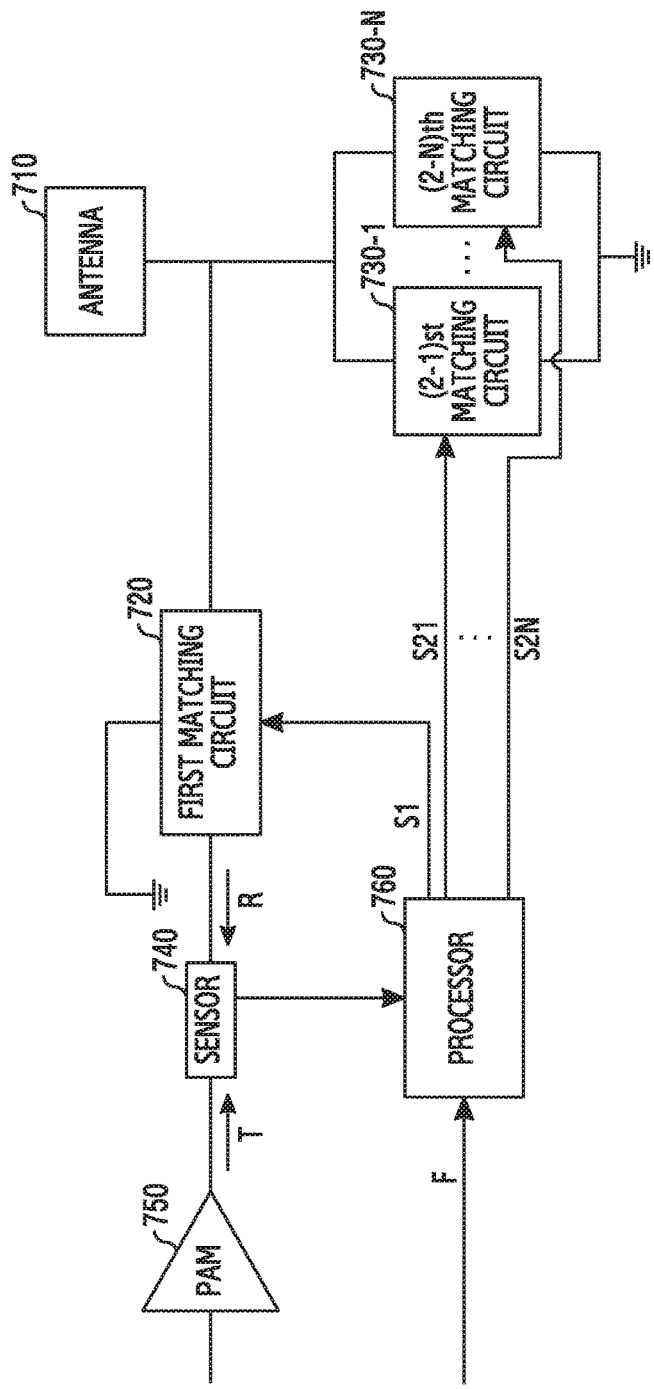
FIG. 7 is a block diagram illustrating the configuration of an electronic device for performing impedance matching according to another embodiment of the present disclosure.

FIG. 7 is a block diagram illustrating a configuration of an electronic device for performing impedance matching according to another embodiment of the present disclosure.

Referring to FIG. 7, the electronic device 101 may include an antenna 710, a first matching circuit 720, a second matching circuit 730-1 to 730-N, a sensor 740, a PAM 750, and a processor 760, and the like. The configuration of FIG. 7 is at least partially the same as, or similar to the configuration of FIG. 4, so that the duplicated descriptions thereof will be omitted.

In an embodiment, the second matching circuits 730-1 to 730-N may include a plurality of second matching circuits 730-1 to 730-N, for example, a (2-1)st matching circuit 730-1 to a (2-N)th matching circuit 730-N. In an embodiment, the processor 760 may generate control signals S21 to S2N for operating the plurality of second matching circuits 730-1 to 730-N at least partially based on the specified state.

For example, when it is checked by the processor 760 that the matching operation of the current impedance of the antenna is performed by using the (2-N)th matching circuit 730-N (or an element included in the (2-N)th matching circuit 730-N), the processor 760 may generate a control signal S2N for controlling the (2-N)th matching circuit 730-N. In another example, when the impedance matching of the antenna 710 cannot be performed by using the (2-1)st matching circuit 730-1 to the (2-(N−1))th matching circuit 730-(N−1) (or when the impedance matching does not performed even if the (2-1)st matching circuit 730-1 to the (2-(N−1))th matching circuit 730-(N−1) are used) while the matching operation is performed using the (2-1)st matching circuit 730-1 to the (2-(N−1))th matching circuit 730-(N−1), the processor 760 may generate the control signal S2N for controlling the (2-N)th matching circuit 730-N. In an embodiment, when generating the control signal S2N, the processor 760 may generate at least one of the control signal S1 to the control signal S2(N−1) in order to selectively control the (2-1)st matching circuit 730-1 to the (2-(N−1))th matching circuit 730-(N−1). The processor 760 may transmit the generated control signal to a matching circuit corresponding to the control signal.

Figure 8:
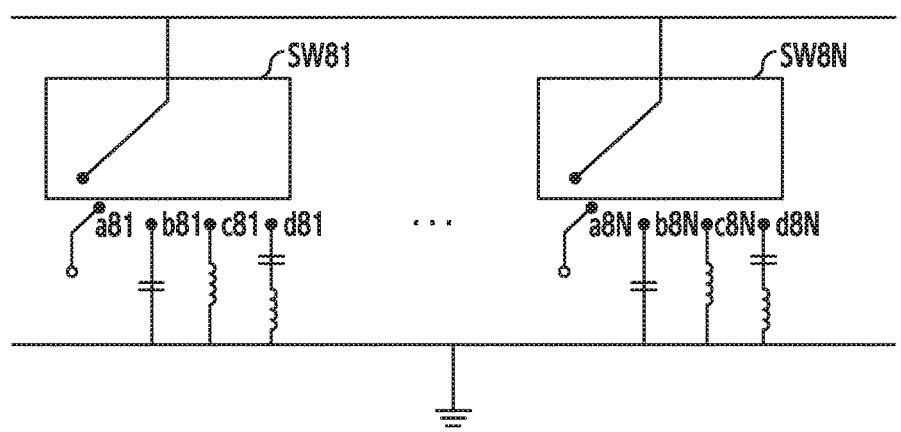
FIG. 8 is a block diagram illustrating a second matching circuit according to another embodiment of the present disclosure.

FIG. 8 is a block diagram illustrating a second matching circuit according to another embodiment of the present disclosure.

Referring to FIG. 8, in an embodiment, each of the plurality of second matching circuits 730-1 to 730-N may include switching elements SW81 to SW8N, and elements capable of being connected to the switching elements SW81 to SW8N.

In an embodiment, each of the plurality of switching elements SW81 to SW8N corresponding to each of the plurality of second matching circuits 730-1 to 730-N may be connected to nodes a81 to a8N of an open circuit, nodes b81 to b8N connected to capacitors, nodes c81 to c8N connected to inductors, and nodes d81 to d8N connected to capacitors and inductors, according to the plurality of control signals S2.

In an embodiment, the second matching circuit 730-1 to 730-N of FIG. 8 is illustrated as an example, and the technical idea of the present disclosure is not limited thereto.

Figure 9:
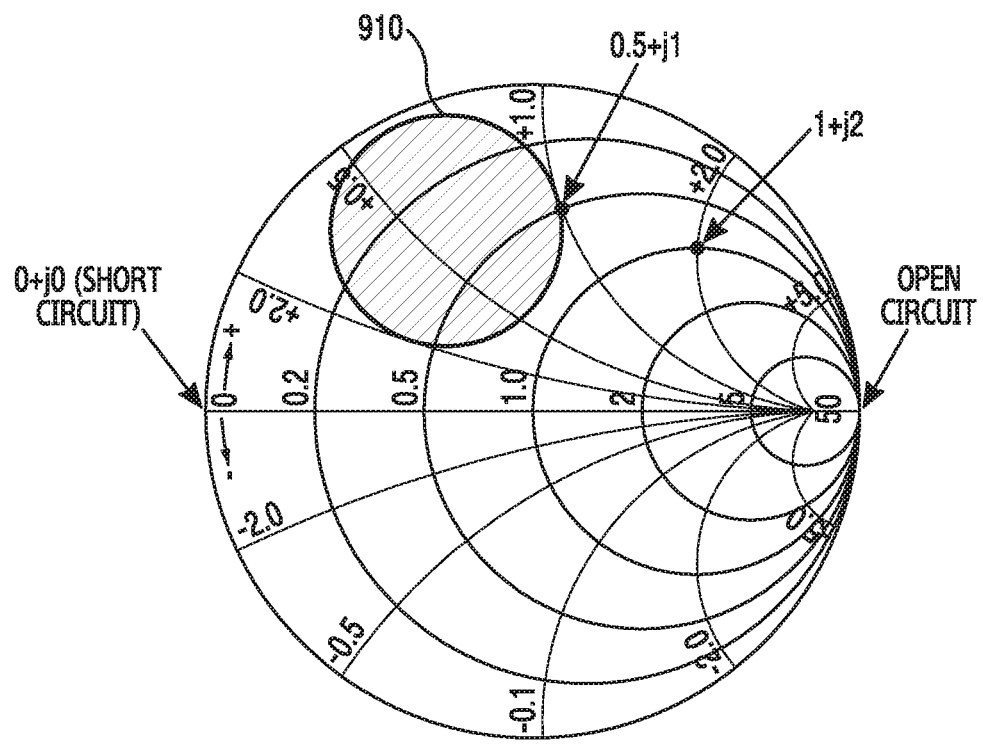
FIGS. 9, 10, and 11 are diagrams illustrating Smith charts for exemplifying a method of performing impedance matching according to various embodiments of the present disclosure.
Figure 10:
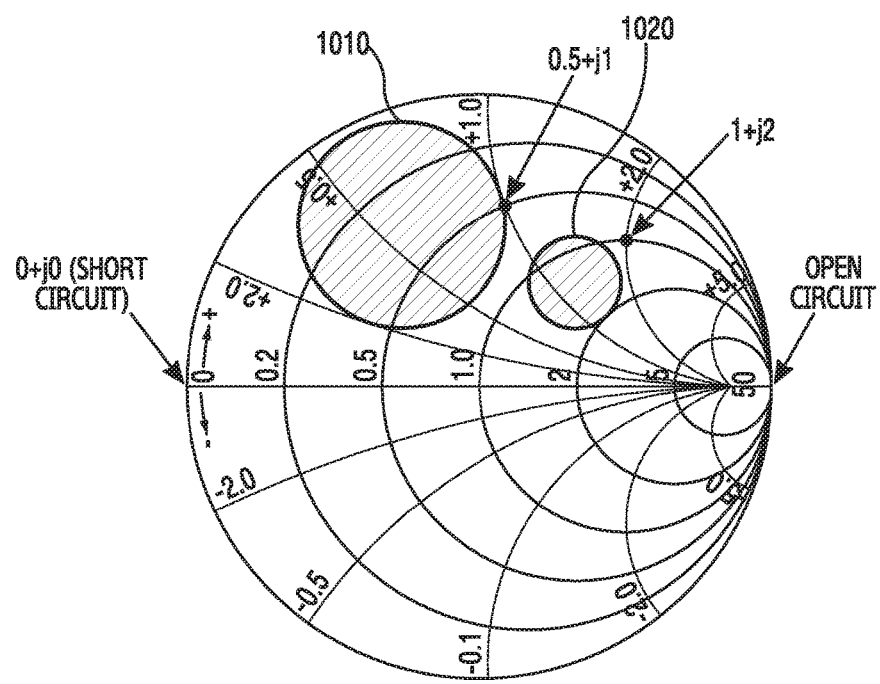
Figure 11:
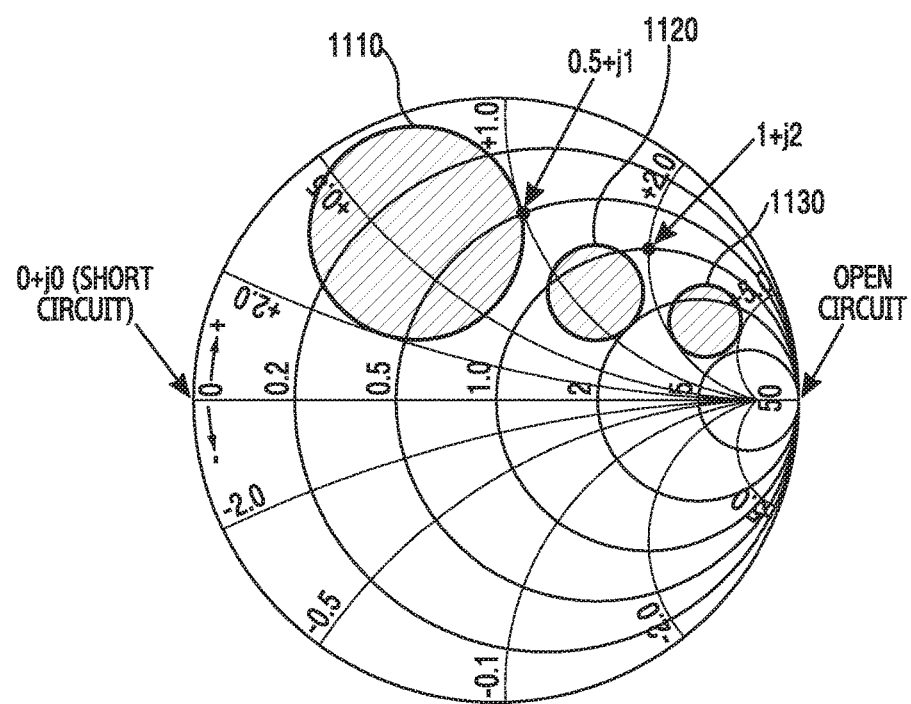

FIGS. 9, 10, and 11 are diagrams illustrating Smith charts for exemplifying a method of performing impedance matching according to various embodiments of the present disclosure.

Referring to FIG. 9, when the current impedance of the antenna corresponds to an area 910 on the Smith chart, for example, when a ratio of the characteristic impedance to the current impedance of the antenna (or a normalized value) is included in the area 910, the processor (e.g., the processor 460 of FIG. 4) may generate the control signal S1 for performing the impedance matching and transmit the generated control signal S1 to the first matching circuit (e.g., the first matching circuit 420 in FIG. 4), so as to perform the impedance matching. In an embodiment, the area 910 in FIG. 9 is shown as one area, but is not limited thereto. For example, the area 910 may include a plurality of areas according to the configuration of the first matching circuit (e.g., the first matching circuit 420 in FIG. 4), for example, the number of switching elements included in the first matching circuit (e.g., the first matching circuit 420 in FIG. 4) and the capacitance of the variable capacitor.

Referring to FIG. 10, the processor (e.g., the processor 460 of FIG. 4) may check that the impedance of the antenna has changed to a specified state corresponding to an area 1020 while performing the matching operation using the first matching circuit (e.g., the first matching circuit 420 of FIG. 4) according to the impedance of the antenna being corresponded to an area 1010. When the impedance of the antenna is changed to correspond to the area 1020, the processor (e.g., the processor 460 of FIG. 4) may generate the control signal S2 for controlling the second matching circuit (e.g., the second matching circuit 430 of FIG. 4) and the control signal S1 for selectively controlling the first matching circuit (e.g., the first matching circuit 420 in FIG. 4), so as to perform the impedance matching. For example, a processor (e.g., the processor 460 of FIG. 4) may generate only the control signal S2 when the matching may be performed using the second matching circuit (e.g., the second matching circuit 430 of FIG. 4). In another example, when the matching may not be performed using only the second matching circuit (e.g., the second matching circuit 430 of FIG. 4), the processor (e.g., the processor 460 of FIG. 4) may generate the control signal S2 for controlling the second matching circuit (e.g., the second matching circuit 430 of FIG. 4) in order to change the normalized value included in the area 1020 to a value included in the area 1010, and may generate the control signal S1 for controlling the first matching circuit (e.g., the first matching circuit 420 of FIG. 4) in order to change (or move) the normalized value that has been changed to be included in the area 1010 to a center point on the Smith chart.

Referring to FIG. 11, the processor (e.g., the processor 760 of FIG. 7) may check that the impedance of the antenna has changed to the specified state corresponding to an area 1130 while the impedance matching operation is performed using the first matching circuit (the first matching circuit 720 of FIG. 7) and the second matching circuit (e.g., the (2-1)st matching circuit 730-1 of FIG. 7). When the impedance of the antenna (or a normalized value) has changed to correspond to an area 1130 from the state of being correspond to an area 1120, the processor (e.g., the processor 760 of FIG. 7) may generate the control signal S22 for controlling the second matching circuit (e.g., the (2-2)nd matching circuit 730-2 of FIG. 7), the control signal S1 for selectively controlling the first matching circuit and the control signal S21 for controlling the second matching circuit (e.g., the (2-1)st matching circuit 730-1 of FIG. 7). For example, the processor (e.g., the processor 760 of FIG. 7) may generate only the control signal S22 when the matching can be performed using the second matching circuit (e.g., the (2-2)nd matching circuit 730-2 of FIG. 7). In another example, when the matching may not be performed using only the second matching circuit (e.g., the (2-2)nd matching circuit 730-2 of FIG. 7), the processor (e.g., the processor 460 of FIG. 4) may generate the control signal S22 for moving a normalized value included in the area 1130 to the area 1110 or the area 1120, and may further generate at least one of the control signal S1 and control signal S21 in order to move the normalized value that has been moved to the area 1110 or area 1120 to the center point on the Smith chart.

Figure 12:
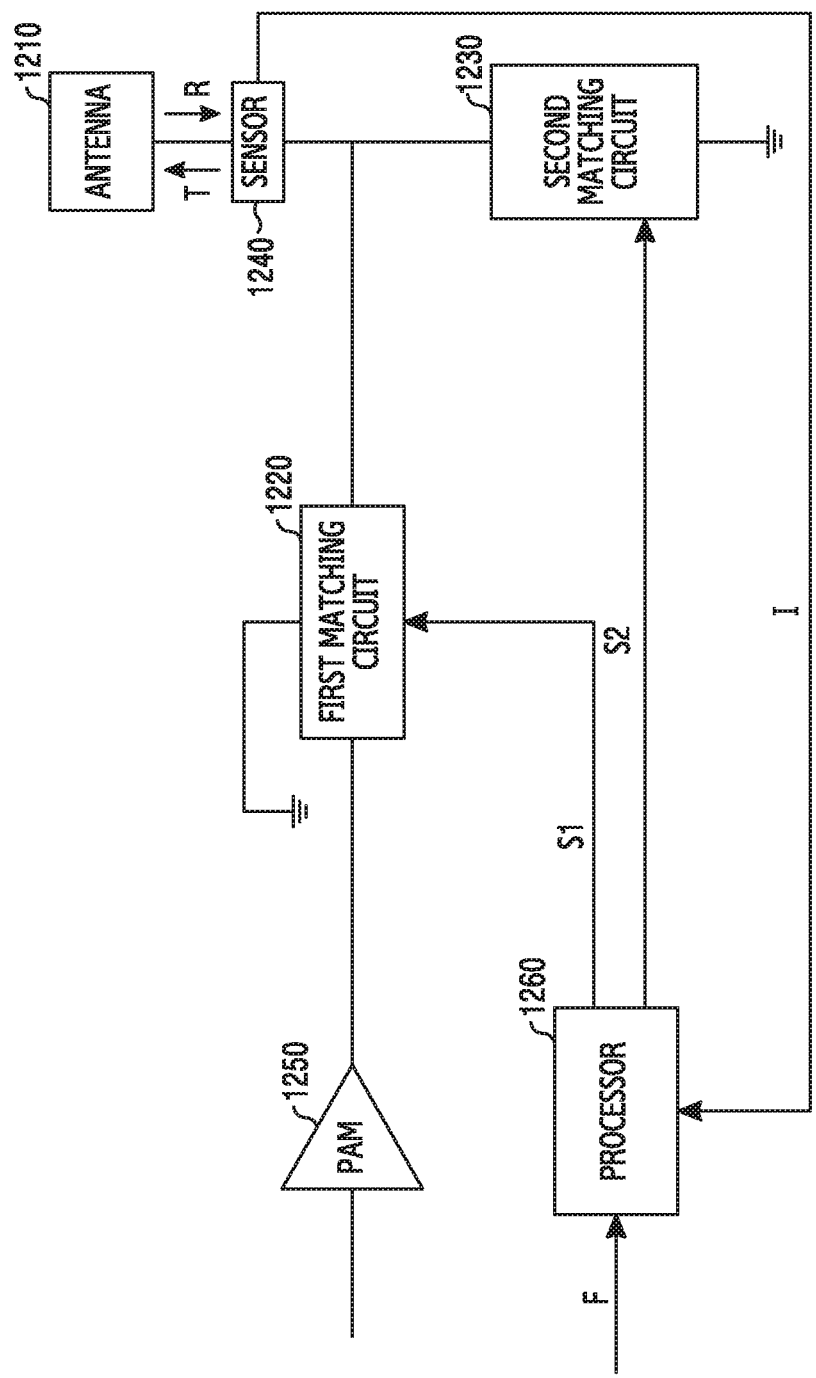
FIG. 12 is a block diagram exemplifying the configuration of an electronic device for performing impedance matching according to another embodiment of the present disclosure.

FIG. 12 is a block diagram exemplifying the configuration of an electronic device for performing impedance matching according to another embodiment of the present disclosure.

Referring to FIG. 12, the electronic device 101 may include an antenna 1210, a first matching circuit 1220, a second matching circuit 1230, a sensor 1240, a PAM 1250, and a processor 1260, and the like.

FIG. 12 is a diagram at least partially the same as or similar to FIG. 4, so duplicate descriptions thereof are omitted.

When FIG. 12 is compared with FIG. 4, in FIG. 12, the sensor 1240 may be electrically connected to the antenna

1210, the first matching circuit 1220, the second matching circuit 1230, and the processor 1260. For example, the sensor 1240 may detect a transmission signal T, which is received through the first matching circuit 1220 from the PAM 1250, and a reflection signal R received by the antenna. The sensor 1240 may transmit, to the processor 1260, the detected transmission signal T and reflection signal R, for example, information I on the current impedance of the antenna 1210. In an embodiment, the sensor 1240 may include a coupler. However, the present disclosure is not limited thereto.

An electronic device according to various embodiments of the present disclosure may include a communication module; and a processor electrically connected to the communication module, the communication module including an antenna configured to transmit and receive a communication signal, a sensor configured to measure an impedance of the antenna, and a first matching circuit and a second matching circuit electrically connected to the antenna, and the processor is configured to receive information on the impedance of the antenna from the sensor, check control information on at least one of the first matching circuit and the second matching circuit corresponding to the impedance of the antenna at least partially based on the received information on the impedance of the antenna, and transmit control information generated at least partially based on the checked control information to at least one of the first matching circuit and the second matching circuit corresponding to the control information.

In an embodiment, the first matching circuit may be electrically connected to the antenna, the sensor, and the processor, and the second matching circuit may be electrically connected to the antenna and the processor.

In an embodiment, the communication module further includes the PAM, and the sensor may be electrically connected to the PAM, the first matching circuit, and the processor, detect the transmission signal, transmitted from the PAM to the antenna, and the reflection signal transmitted by the antenna, and transmit the detected transmission signal and reflection signal to the processor.

In an embodiment, the communication module may further include the PAM, and the sensor may be electrically connected to the antenna, the first matching circuit, the second matching circuit, and the processor, detect the transmission signal, transmitted from the PAM through the first matching circuit to the antenna, and the reflection signal transmitted by the antenna, and transmit the detected transmission signal and reflection signal to the processor.

In an embodiment, the sensor may be a coupler.

In an embodiment, the processor may check whether the impedance of the antenna corresponds to a state specified to use the second matching circuit while the impedance matching operation is performed using the first matching circuit, and may be configured to perform the impedance matching operation using the second matching circuit when the impedance of the antenna corresponds to the state specified to use the second matching circuit.

In an embodiment, the processor may be configured to perform an impedance matching operation using the first matching circuit at least partially based on information on the impedance of the antenna received from the sensor after performing the impedance matching operation using the second matching circuit.

In an embodiment, the state specified to use the second matching circuit may include at least one of a state where there is a change in the impedance in which the impedance matching operation is not possible using only the first matching circuit, a state where there is a change in the frequency band currently being used for communication, a state where there is a change in the impedance of the antenna to be within the specified impedance range, and a state where a specified event has been received.

In an embodiment, the second matching circuit includes a plurality of second matching circuits, and the processor is configured to perform the impedance matching operation using at least one of the plurality of second matching circuits according to the specified state.

In an embodiment, the processor may include a CP, an MP, or a BP.

Figure 13:
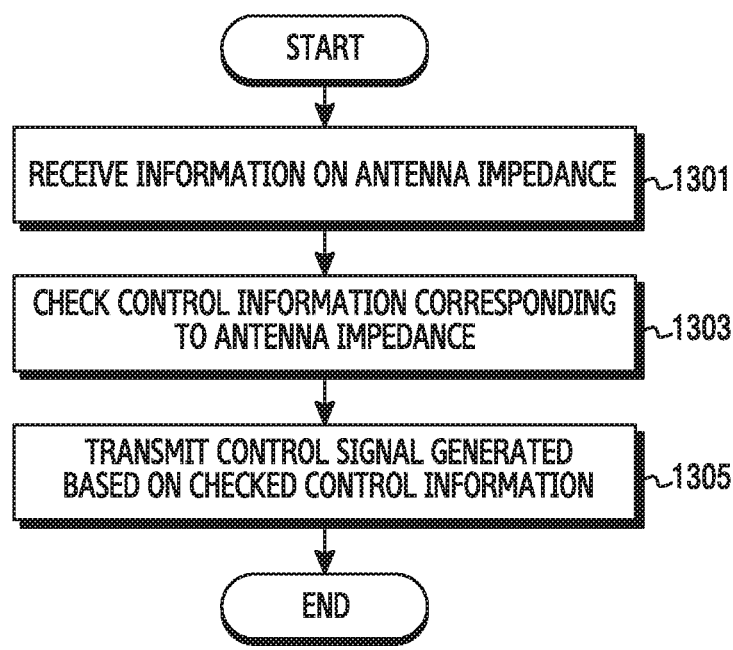
FIG. 13 is a flowchart illustrating a method for performing communication according to an embodiment of the present disclosure.

FIG. 13 is a flowchart for illustrating a method for performing communication according to an embodiment of the present disclosure.

Referring to FIG. 13, in operation 1301, a processor (e.g., the processor 120 of FIG. 1) may receive information on the impedance of the antenna (e.g., the antenna 410 of FIG. 4). For example, the processor may receive information on the current impedance of the antenna from a sensor (e.g., the sensor 440 of FIG. 4) that is electrically connected to a PAM (e.g., the PAM 450 of FIG. 4) and a first matching circuit (e.g., the first matching circuit 420 of FIG. 4). In another embodiment, the processor may receive information on the current impedance of the antenna from the sensor electrically connected to the antenna and first matching circuit.

In an embodiment, the sensor may include a coupler. However, the present disclosure is not limited thereto.

In an embodiment, the processor may include a CP, an MP, or a BP. However, the present disclosure is not limited thereto.

In an embodiment, although not shown in FIG. 13, the processor may further receive, from another processor (e.g., AP, etc.), information on the frequency band currently being used for communication.

In operation 1303, in an embodiment, the processor may check control information corresponding to the current impedance of the antenna at least partially based on information on the current impedance of the antenna.

In an embodiment, the processor may search for a table in which the frequency band currently being used for communication and the current impedance of the antenna are mapped to control information corresponding to the frequency band currently being used for communication and the current impedance of the antenna, so as to check control information on a matching circuit corresponding to the impedance of the antenna.

In an embodiment, when at least one of the first matching circuit and the second matching circuit (e.g., the second matching circuit 430 of FIG. 4) includes a switching element, the table may include control information on the on/off configuration of the switching element. In another embodiment, when the switching element included in at least one of the first matching circuit and second matching circuit is switched by a capacitive element, an inductive element, or a combination thereof, the table may include control information and the like for establishing a connection with the capacitive element, the inductive element, or a combination thereof. In an embodiment, the table may be stored in the memory 130 or the processor. However, the present disclosure is not limited thereto.

In an embodiment, the table may be shown in Table 1 as follows.

TABLE 1

| index | Normalized impedance of antenna | Control information on first matching circuit |
|---|---|---|
| 1 | $R_1 + X_1j$ | SW1: on, SW2: off, SW3: off, . . . , $C_{11}$: 5.1 pF, . . . |
| 2 | $R_2 + X_2j$ | SW1: off, SW2: on, SW3: off, . . . , $C_{11}$: 1.6 pF, . . . |
| . | . | . |
| . | . | . |
| . | . | . |
| N − 2 | $R_{N-2} + X_{N-2}j$ | . . . |
| N − 1 | $R_{N-1} + X_{N-1}j$ | . . . |
| N | $R_N + X_Nj$ | . . . |

In Table 1, the capacitance $C_{11}$ represents a variable capacitance, and is measured in units called farad. Table 1 shows control information on the first matching circuit, but it is not limited thereto. For example, the table may include control information on at least one of the first matching circuit and the second matching circuit. In addition, although Table 1 illustrates control information on the capacitor as an example, Table 1 may further include control information on an inductor when the inductor is included in the matching circuit according to the embodiment. In addition, in Table 1, the switching operation and the capacitance of the variable capacitor may be determined differently according to the frequency band currently being used (or a center frequency).

In operation 1305, the processor may transmit a control signal generated at least partially based on the checked control information to at least one of the first matching circuit and second matching circuit corresponding to the control signal.

For example, when the control signal for controlling the first matching circuit is generated at least partially based on the control information corresponding to the current impedance of the antenna, the processor may transmit the generated control signal to the first matching circuit. In another example, when the control signal for controlling the second matching circuit is generated at least partially based on the control information corresponding to the current impedance of the antenna, the processor may transmit the generated control signal to the second matching circuit. In another example, when the control signal for controlling the first matching circuit and second matching circuit is generated at least partially based on the control information corresponding to the current impedance of the antenna, the processor may transmit control signals corresponding to the first and second matching circuits, respectively.

Although not shown in FIG. 13, the processor may generate a control signal for periodically controlling the matching circuit at least partially based on information on the current impedance of the antenna received from the sensor. For example, the processor may generate a control signal for periodically controlling the matching circuit at least partially based on a count operation of a timer. However, the present disclosure is not limited thereto.

Figure 14:
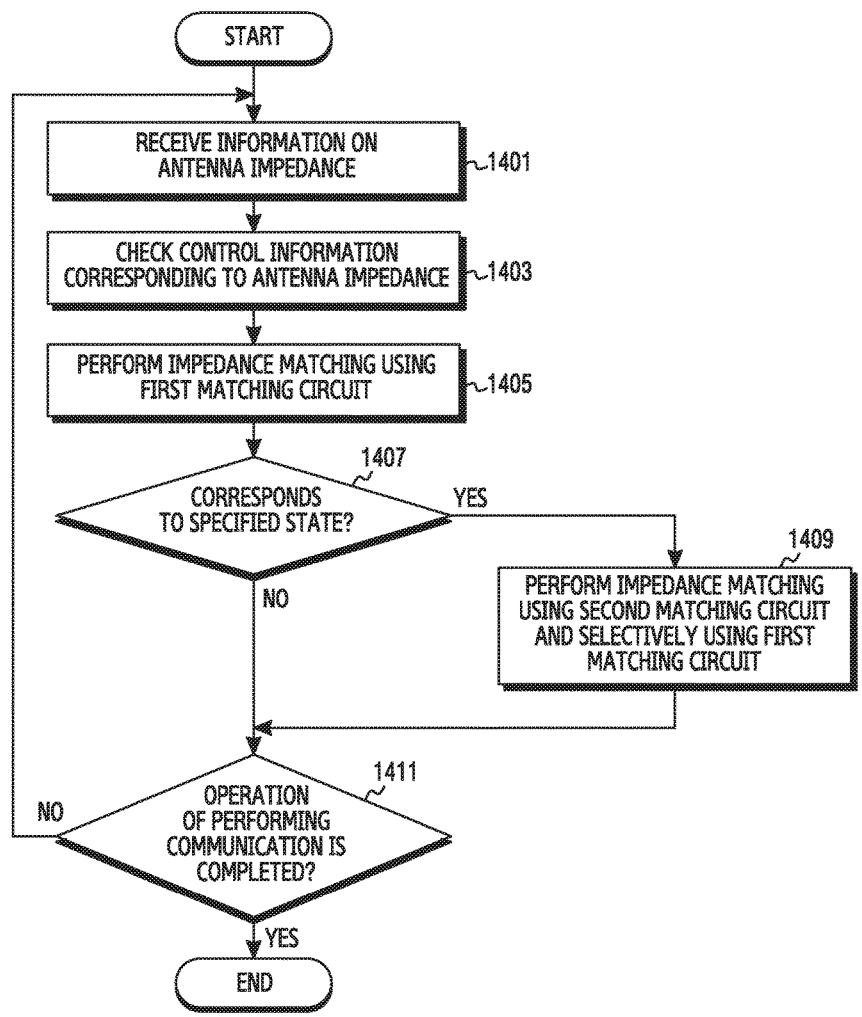
FIG. 14 is a flowchart illustrating a method for performing communication according to another embodiment of the present disclosure.

FIG. 14 is a flowchart illustrating a method for performing communication according to another embodiment of the present disclosure.

Referring to FIG. 14, in operation 1401, a processor (e.g., the processor 120 of FIG. 1) may receive information on the impedance of the antenna (e.g., the antenna 410 of FIG. 4). For example, the processor may receive information on the current impedance of the antenna from a sensor (e.g., the sensor 440 of FIG. 4) that is electrically connected to a PAM (e.g., the PAM 450 of FIG. 4) and a first matching circuit (e.g., the first matching circuit 420 of FIG. 4). In another embodiment, the processor may receive information on the current impedance of the antenna from a sensor electrically connected to the antenna and first matching circuit. In an embodiment, although not shown in FIG. 14, the processor may further receive, from another processor (e.g., AP, etc.), information on the frequency band currently being used for communication.

In operation 1403, in an embodiment, the processor may check control information corresponding to the impedance of the antenna at least partially based on information on the current impedance of the antenna. For example, the processor may check control information on the first matching circuit corresponding to the impedance of the antenna at least partially based on information on the current impedance of the antenna. For example, the processor may check the control information on the first matching circuit corresponding to the current impedance of the antenna using the Table 1. However, the present disclosure is not limited thereto.

In operation 1405, the processor may perform the impedance matching using the first matching circuit. For example, the processor may transmit the control signal generated at least partially based on the control information on the first matching circuit to the first matching circuit so as to perform the impedance matching. However, the present disclosure is not limited thereto.

In operation 1407, the processor may check whether the current impedance of the antenna corresponds to a specified state (or a state specified to use a second matching circuit (e.g., the second matching circuit 430 of FIG. 4)). In an embodiment, the specified state may include a state where there is a change in impedance in which the impedance matching cannot be performed using only the first matching circuit. For example, the specified state may include a case where the impedance change has occurred where the impedance matching cannot be performed using only the first matching circuit, such as when a USB connector or an ear jack is connected to the electronic device. In another embodiment, the specified state may include a state where there is a change in the frequency band in which radio signals are transmitted and received. For example, the specified state may include a case where the frequency band used for transmitting the radio signal is changed from a first frequency band to a second frequency band. However, the specified state is not limited to the above-described example. For example, the specified state may include a case where the impedance of the antenna changes to a specified range (or a specified impedance range). In another example, the specified state may include a state where the processor receives the specified event. However, the present disclosure is not limited thereto.

In operation 1409, when it is checked that the current impedance of the antenna corresponds to the specified state in operation 1407, the processor may perform impedance matching using the second matching circuit and selectively using the first matching circuit.

For example, the processor may generate a control signal for controlling the second matching circuit when it is checked that the current impedance of the antenna corresponds to a specified state. The processor may transmit the control signal generated for controlling the second matching circuit to the second matching circuit, and then receive again information on the impedance of the antenna. In an embodiment, the processor may generate a control signal for controlling the first matching circuit according to the received information on the impedance of the antenna, and transmit the generated control signal to the first matching circuit. For example, the processor may perform an impedance matching operation using the second matching circuit, and further perform an impedance matching operation using the first matching circuit at least partially based on the received information on the impedance of the antenna.

In an embodiment, when the second matching circuit is configured by a plurality of matching circuits as shown in FIG. 7, a state that is specified to use the second matching circuit may vary. For example, the processor may configure various specified states according to the number of a plurality of matching circuits included in the second matching circuit, or the number of elements capable of being connected to the switching elements by the switching operation, which are included in each of the plurality of matching circuits. However, the present disclosure is not limited thereto.

In operation 1411, the processor may check whether an operation of performing communication has been completed. For example, the processor may check whether an input for completing the communication is received from the user. In another example, the processor may check whether the electronic device has completed a data transmission/reception operation. However, the present disclosure is not limited thereto.

In operation 1411, when it is checked that the communication has not been completed, the processor may return to operation 1401 and continue to perform operations after operation 1401.

In operation 1411, when it is checked that the communication has been completed, the processor may terminate the operation for performing communication.

A method for performing communication and an electronic device supporting the same according to various embodiments of the present disclosure can minimize power consumption by controlling the matching circuit in an adaptive manner according to the impedance of the antenna.

A method according to various embodiments of the present disclosure may include receiving information on the impedance of the antenna from a sensor, checking control information on at least one of a first matching circuit and a second matching circuit, which correspond to the impedance of the antenna and are electrically connected to the antenna at least partially based on the received information on the impedance of the antenna, and transmitting the control information generated at least partially based on the checked control information to at least one of the first matching circuit and the second matching circuit corresponding to the control information.

In an embodiment, the first matching circuit may be electrically connected to the antenna, the sensor, and the processor, and the second matching circuit may be electrically connected to the antenna and the processor.

In an embodiment, the sensor may be electrically connected to the PAM, the first matching circuit, and the processor, and may detect the transmission signal, transmitted from the PAM to the antenna, and the reflection signal transmitted by the antenna, and transmit the detected transmission signal and reflection signal to the processor.

In an embodiment, the sensor may be electrically connected to the antenna, the first matching circuit, the second matching circuit, and the processor, detect the transmission signal, transmitted from the PAM through the first matching circuit to the antenna, and the reflection signal transmitted by the antenna, and transmit the detected transmission signal and reflection signal to the processor.

In an embodiment, the sensor may be a coupler.

In an embodiment, the processor may further include: checking whether the impedance of the antenna corresponds to a state specified to use the second matching circuit while performing the impedance matching operation using the first matching circuit, and performing an impedance matching operation using the second matching circuit when the impedance of the antenna corresponds to a state specified to use the second matching circuit.

In an embodiment, the processor may further include performing an impedance matching operation using the first matching circuit at least partially based on information on the impedance of the antenna received from the sensor after performing the impedance matching operation using the second matching circuit.

In an embodiment, the state specified to use the second matching circuit may include at least one of a state where there is a change in the impedance in which impedance matching cannot be performed using only the first matching circuit, a state where there is a change in the frequency band currently being used for communication, a state where there is a change in the impedance of the antenna to be within the specified impedance range, and a state where a specified event has been received.

In an embodiment, the second matching circuit may include a plurality of second matching circuits, and the processor may further include performing an impedance matching operation using at least one of the plurality of second matching circuits according to the specified state.

In addition, the structure of data used in the various embodiments of the present disclosure described above may be recorded on a computer-readable recording medium through various means. The computer-readable recording medium includes a storage medium such as a magnetic storage medium (e.g., ROM, floppy disk, hard disk, etc.), optical readable media (e.g., compact disc (CD)-ROM, DVD, etc.).

In an embodiment, a computer-readable storage medium in which a program including instructions is recorded, wherein the instructions, when executed by at least one processor, cause the at least one processor to perform at least one operation including: receiving information on the impedance of the antenna from a sensor; checking control information on at least one of a first matching circuit and a second matching circuit which correspond to the impedance of the antenna and are electrically connected to the antenna at least partially based on the received information on the impedance of the antenna; and transmitting control information generated at least partially based on the checked control information to at least one of the first matching circuit and the second matching circuit corresponding to the control information.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a communication module;
   a power amplifier module (PAM); and
   a processor electrically connected to the communication module,
   wherein the communication module comprises:
      at least one antenna configured to transmit and receive a communication signal and including a first antenna, a sensor configured to measure an impedance of the first antenna, and a first matching circuit and a second matching circuit electrically connected to the first antenna, the first matching circuit being connected between the PAM and the first antenna and the second matching circuit is connected between the first antenna and a ground, and wherein the processor is configured to:

in response to detecting that an ear jack is connected to the electronic device:

identify first control information on the first matching circuit and the second matching circuit, the first control information corresponding to a first change of the impedance of the first antenna, the first change occurring by a connection between the ear jack and the electronic device, and transmit the identified first control information to the first matching circuit and the second matching circuit, wherein a first impedance matching operation is performed using both the first matching circuit and the second matching circuit, in response to receiving, from the sensor, information on a second change of the impedance of the first antenna, the second change of the impedance occurring when the electronic device is gripped by a user or an external object is in proximity to the electronic device:

identify second control information on the first matching circuit, the second control information corresponding to the second change, and transmit the identified second control information to the first matching circuit between the first matching circuit and the second matching circuit, wherein a second impedance matching operation is performed using the first matching circuit, wherein the second matching circuit comprises a plurality of second matching circuits, wherein each of the plurality of second matching circuits is connected between the first antenna and a ground and includes a switching element, and wherein the plurality of second matching circuits respectively receive a plurality of control signals included in the first control information from the processor.

2. The electronic device of claim 1, wherein the first matching circuit is electrically connected to the first antenna, the sensor, and the processor, and wherein the second matching circuit is electrically connected to the first antenna and the processor.

3. The electronic device of claim 1, wherein the sensor is electrically connected to the PAM, the first matching circuit, and the processor, and wherein the sensor is further configured to:

detect a transmission signal, transmitted from the PAM to the first antenna, and a reflection signal transmitted by the first antenna, and transmit the detected transmission signal and reflection signal to the processor.

4. The electronic device of claim 1, wherein the sensor is electrically connected to the first antenna, the first matching circuit, the second matching circuit, and the processor, and wherein the sensor is further configured to:

detect a transmission signal, transmitted from the PAM through the first matching circuit to the first antenna, and a reflection signal transmitted by the first antenna, and transmit the detected transmission signal and reflection signal to the processor.

5. The electronic device of claim 1, wherein the sensor comprises a coupler.

6. The electronic device of claim 1, wherein the processor is further configured to:

identify whether the impedance of the first antenna corresponds to a state specified to use the second matching circuit while performing an impedance matching operation using the first matching circuit, and perform the impedance matching operation using the second matching circuit when the impedance of the first antenna corresponds to a state specified to use the second matching circuit.

7. The electronic device of claim 6, wherein the processor is further configured to perform an impedance matching operation using the first matching circuit at least partially based on information on the impedance of the first antenna received from the sensor after performing the impedance matching operation using the second matching circuit.

8. The electronic device of claim 6, wherein the state specified to use the second matching circuit includes at least one of a state where there is a change in the impedance in which the impedance matching operation is not possible using only the first matching circuit, a state where there is a change in the frequency band currently being used for communication, a state where there is a change in the impedance of the first antenna to be within specified impedance range, or a state where a specified event has been received, wherein the state further comprises a state where the USB connector or the ear jack is connected to the electronic device.

9. The electronic device of claim 1, wherein the processor comprises a communication processor (CP), a modem processor (MP), or a baseband processor (BP).

10. A method comprising:

in response to detecting that an ear jack is connected to an electronic device:

identifying first control information on a first matching circuit and a second matching circuit, the first control information corresponding to a first change of the impedance of a first antenna of at least one antenna of the electronic device, the first change occurring by a connection between the ear jack and the electronic device, the first matching circuit being connected between a power amplifier module (PAM) and the first antenna and the second matching circuit is connected between the first antenna and a ground; and transmitting the identified first control information to the first matching circuit and the second matching circuit, wherein a first impedance matching operation is performed using both the first matching circuit and the second matching circuit, in response to receiving, from a sensor, information on a second change of the impedance of the first antenna, the second change of the impedance occurring when the electronic device is gripped by a user or an external object is in proximity to the electronic device:

identifying second control information on the first matching circuit, the second control information corresponding to the second change; and transmitting the identified second control information to the first matching circuit between the first matching circuit and the second matching circuit, wherein a second impedance matching operation is performed using the first matching circuit,
wherein the second matching circuit comprises a plurality of second matching circuits,
wherein each of the plurality of second matching circuits is connected between the first antenna and a ground and includes a switching element, and
wherein the plurality of second matching circuits respectively receive a plurality of control signals included in the first control information from the processor.

11. The method of claim 10,
wherein the first matching circuit is electrically connected to the first antenna, the sensor, and the processor, and
wherein the second matching circuit is electrically connected to the first antenna and the processor.

12. The method of claim 10, wherein the sensor is electrically connected to the PAM, the first matching circuit, and the processor, detects a transmission signal, transmitted from the PAM to the first antenna, and a reflection signal transmitted by the first antenna, and transmits the detected transmission signal and reflection signal to the processor.

13. The method of claim 10,
wherein the sensor is electrically connected to the first antenna, the first matching circuit, the second matching circuit, and the processor, and
wherein the sensor detects a transmission signal, transmitted from the PAM through the PAM to the first antenna, and a reflection signal transmitted by the first antenna, and transmits the detected transmission signal and reflection signal to the processor.

14. The method of claim 10, wherein the sensor comprises a coupler.

15. The method of claim 10, further comprising:
identifying whether the impedance of the first antenna corresponds to a state specified to use the second matching circuit while performing an impedance matching operation using the first matching circuit; and
performing the impedance matching operation using the second matching circuit when the impedance of the first antenna corresponds to a state specified to use the second matching circuit.

16. The method of claim 15, further comprising:
performing the impedance matching operation using the first matching circuit at least partially based on information on the impedance of the first antenna received from the sensor after performing the impedance matching operation using the second matching circuit.

17. The method of claim 15,
wherein the state specified to use the second matching circuit includes at least one of a state where there is a change in the impedance in which the impedance matching is not possible using only the first matching circuit, a state where there is a change in the frequency band currently being used for communication, a state where there is a change in the impedance of the first antenna to be within the specified impedance range, or a state where a specified event has been received,
wherein the state further comprises a state where the USB connector or the ear jack is connected to the electronic device.

18. A non-transitory computer-readable recording medium in which a program including instructions is recorded, the instructions executed by at least one processor, cause the at least one processor of the electronic device to perform a method comprising:
in response to detecting that an ear jack is connected to the electronic device:
identifying first control information on a first matching circuit and a second matching circuit, the first control information corresponding to a first change of the impedance of a first antenna of at least one antenna of the electronic device, the first change occurring by a connection between the ear jack and the electronic device, the first matching circuit being connected between a power amplifier module (PAM) and the first antenna and the second matching circuit is connected between the first antenna and a ground; and
transmitting the identified first control information generated at least partially based on the identified control information to the first matching circuit and the second matching circuit, wherein a first impedance matching operation is performed using both the first matching circuit and the second matching circuit,
in response to receiving, from a sensor, information on a second change of the impedance of the first antenna, the second change of the impedance occurring when the electronic device is gripped by a user or an external object is in proximity to the electronic device:
identifying second control information on the first matching circuit, the second control information corresponding to the second change; and
transmitting the identified second control information to the first matching circuit between the first matching circuit and the second matching circuit, wherein a second impedance matching operation is performed using the first matching circuit,
wherein the second matching circuit comprises a plurality of second matching circuits,
wherein each of the plurality of second matching circuits is connected between the first antenna and a ground and includes a switching element, and
wherein the plurality of second matching circuits respectively receive a plurality of control signals included in the first control information from the at least one processor.

* * * * *